US 7,374,704 B2

(12) United States Patent
Che et al.

(10) Patent No.: US 7,374,704 B2
(45) Date of Patent: May 20, 2008

(54) METHOD OF PRODUCING SPHERICAL OXIDE POWDER

(75) Inventors: Shenglei Che, Tokyo (JP); Ikuka Chiba, Tokyo (JP); Shigeo Okamoto, Tokyo (JP); Tomohiro Sogabe, Tokyo (JP)

(73) Assignee: TDK Corporation, Tokyo (JP)

( * ) Notice: Subject to any disclaimer, the term of this patent is extended or adjusted under 35 U.S.C. 154(b) by 589 days.

(21) Appl. No.: 10/483,315

(22) PCT Filed: Jul. 26, 2002

(86) PCT No.: PCT/JP02/07595

§ 371 (c)(1),
(2), (4) Date: May 10, 2004

(87) PCT Pub. No.: WO03/010092

PCT Pub. Date: Feb. 6, 2003

(65) Prior Publication Data

US 2004/0180991 A1    Sep. 16, 2004

(30) Foreign Application Priority Data

Jul. 27, 2001   (JP)  ............................. 2001-227077
Nov. 9, 2001   (JP)  ............................. 2001-345307

(51) Int. Cl.
*C04B 35/468*  (2006.01)
*C08K 3/10*  (2006.01)

(52) U.S. Cl. ......................................... 264/13; 264/15

(58) Field of Classification Search ............. 264/13–15
See application file for complete search history.

(56) References Cited

U.S. PATENT DOCUMENTS 5,140,005 A      8/1992  Rangaswamy et al.
6,045,913 A *    4/2000  Castle ......................... 428/403

FOREIGN PATENT DOCUMENTS

| JP | 53-109519 | 9/1978 |
| JP | 05-105502 | 4/1993 |
| JP | 05-128912 | 5/1993 |
| JP | 08-048560 | 2/1996 |
| JP | 08-069712 | 3/1996 |
| JP | 09-031006 | 2/1997 |
| JP | 11-514963 | 12/1999 |
| JP | 2000-107585 | 4/2000 |
| JP | 2001-019425 | 1/2001 |
| JP | 2001-097712 | 4/2001 |
| JP | 2001-187831 | 7/2001 |

* cited by examiner

*Primary Examiner*—Carlos Lopez
(74) *Attorney, Agent, or Firm*—Hogan & Hartson LLP

(57) ABSTRACT

The present invention provides a production method of spherical oxide powder which includes a feeding step in which a granular powder composed of an oxide composition is fed into a combustion flame together with a carrier gas; a melting step in which said fed granular powder is melted in said combustion flame to obtain a melt; and a solidifying step in which said melt is solidified by being moved and placed outside said combustion flame.

4 Claims, 7 Drawing Sheets

(a) Pulverized powder (b) Spherical powder

Fig. 6

| No. | Amount of dielectric ceramics (vol%) | Amount of polyvinyl benzyl ether compound (vol%) | $\varepsilon$ (at 2GHz) | Q (at 2GHz) |
| --- | --- | --- | --- | --- |
| Sample 3 (present invention) | 40 | 60 | 8.80 | 349.0 |
| Sample 4 (present invention) | 45 | 55 | 10.37 | 372.0 |
| Sample 5 (present invention) | 50 | 50 | 12.28 | 384.0 |
| Sample 2 (comparison example) | 40 | 60 | 9.52 | 329.0 |

Formula (1)

| R₁ | R₂ | R₃<br>H: Vinylbenzyl (molar ratio) | n |
|---|---|---|---|
| Methyl | Benzyl | 0:100 | 3 |
| Methyl | Benzyl | 5:95 | 3 |
| Methyl | Benzyl | 60:40 | 3 |
| Methyl | Benzyl | 40:60 | 3 |
| Methyl | Benzyl | 20:80 | 3 |

METHOD OF PRODUCING SPHERICAL OXIDE POWDER

BACKGROUND OF THE INVENTION

1. Technical Field

The present invention relates to a production method of spherical oxide powder and a production apparatus of spherical powder, and a composite dielectric material suitable for use in the high frequency region, a substrate and a production method of the substrate.

2. Background Art

A fine oxide powder can be obtained by mixing materials, drying the mixture obtained and subsequently calcinating the dried mixture, and then pulverizing the calcinated mixture with a pulverizing machine such as a ball mill, or the like.

Such oxide powders are used as powders of single material for the cases of dielectric materials and magnetic materials, and some other times used as pastes mixed with an organic vehicle and as composite materials combined with a resin material. An oxide powder which is used as a paste or a composite material is required to have dispersion properties and packing properties for an organic vehicle and a resin material (hereinafter, a generic term "a resin material" will be used) Here, the dispersion properties mean the degree of dispersion of an oxide powder in a resin material, and it is preferable that an oxide powder is dispersed in a resin material with a higher degree of uniformity. In addition, the packing properties signify the quantity of an oxide powder filling in a resin material, and it is preferable that a larger quantity of an oxide powder fills in a resin material. A factor for an oxide powder to acquire the dispersion properties and packing properties for resin materials is the particle size of the powder. In addition to the above described method, a precipitation method can produce oxide powders in which method oxide powders are produced from the liquid phase, but the particle size of the oxide powders thus produced is too fine to acquire the dispersion properties and packing properties for resin materials. On the other hand, an oxide powder obtained by pulverizing as mentioned above, and accordingly the particle shape is so irregular that the dispersion properties and packing properties for resin materials cannot be acquired. In other words, another factor for an oxide powder to acquire the dispersion properties and packing properties for resin materials is the particle shape. Incidentally, in the present specification, a powder signifies an ensemble of particles; when the substance concerned is judged to be appropriately referred to as a powder as being an ensemble of particles, the substance will be referred to as "powder", and when the substance concerned is judged to be appropriately referred to as particles as being units constituting a powder, the substance will be referred to as "particles." Since the powder and the particle share the common fundamental unit, needles to say there are sometimes no substantial differences between the powder and the particle. Accordingly, there are some cases where either the expression of "powder" or the expression of "particles" can be used.

For the purpose of acquiring the dispersion properties and packing properties for resin material, the particles constituting a powder are preferably spherical, and more preferably nearly of the true sphere. In addition, it is preferable that the particle size is uniform, that is, the width of the particle size distribution is small.

A variety of production methods of spherical oxide powders have hitherto been proposed, for example, as in Japanese Patent Laid-Open No. 2000-107585, Japanese Patent Laid-Open No. 8-48560, and Japanese Patent Laid-Open No. 5-105502.

Japanese Patent Laid-Open No. 2000-107585 discloses a production method of spherical oxide powder in which a slurry is prepared by kneading an oxide powder with an appropriate binder, and the slurry is dripped on a high temperature heating body.

In addition, Japanese Patent Laid-Open No. 8-48560 discloses a production method of fine molded oxide spheres in which the oxide powder granules obtained by the spray granulation method are used as nuclei, in producing the fine molded oxide spheres which are produced by molding the oxide powder obtained by the stirring granulation method.

Furthermore, Japanese Patent Laid-Open No. 5-105502 discloses an injection molded material which contains the oxide spherical powder having the mean particle size of 7 µm or below and a binder resin.

The above described production method of Japanese Patent Laid-Open No. 2000-107585 is, however, not suitable for the composite formation with resin materials, since the obtained powder is surely spherical, but the particle size is as large as 0.3 to 1.2 mm (300 to 1200 µm).

The method disclosed in Japanese Patent Laid-Open No. 8-48560 aims at obtaining powders having the size of 0.02 to 0.4 mm (20 to 400 µm) not suitable for composite formation with resin materials.

Japanese Patent Laid-Open No. 5-105502 discloses an injection molded material containing an oxide spherical powder having the mean particle size of 7 µm or below and a binder resin, but does not disclose any specific techniques of obtaining spherical oxide powders.

As stated above, conventionally it has been difficult to obtain those spherical oxide powders having particle size and its distribution, which are suitable for composite formation with resin materials. In particular, no technique has been found for obtaining multicomponent oxides such as a composite oxide.

As a method of obtaining spherical oxide powders other than those described above, the plasma-flame method can be considered to be used. The method using plasma flame consumes an electric power of several hundred kW in addition to the consumption of a large volume of expensive argon gas as carrier gas, and hence there is a problem that the cost is high. Accordingly, the method using plasma flame is still in a position far way from the application to mass production.

Accordingly, the present invention provides a method capable of producing, without raising the cost, an oxide powder which has the particle size suitable for composite formation with resin materials, and is excellent in the dispersion properties and packing properties for resin material. Furthermore, the subject of the present invention is to provide an apparatus suitable for use in such a method of producing a spherical oxide powder. Another subject of the present invention is to provide, by using such spherical oxide powders, a composite dielectric material having a high dielectric constant $\epsilon$ and a low tan $\delta$, and being suitable for use in the high frequency GHz band, and a substrate produced by using the composite dielectric material of the present invention.

DISCLOSURE OF THE INVENTION

The present inventors have investigated the production of spherical oxide powders by melting the materials by use of a combustion flame. The production method of spherical powder using a combustion flame is disclosed, for example, in National Publication of International Patent Application No. 1999-514963, Japanese Patent Laid-Open No. 2001-97712, and Japanese Patent Laid-Open No. 2001-19425. In these prior arts, the materials are irregular shape powders, in particular, typically powders obtained by pulverization.

An irregular shape powder produced by pulverization, however, has a large width of particle size distribution. When such a powder having a large width of particle size distribution is fed into a combustion flame, that is, a powder as a mixture of particles with large particle sizes and particles with small particle sizes is fed into a combustion flame, the following problem occurs. Namely, Particles with large particle sizes sometimes cannot be spheroidized when fed into a combustion flame owing to incomplete melting. For the purpose of melting the particles with large particle sizes, it is easily anticipated that the elevation of the combustion flame temperature or the elongation of the time of staying in the combustion flame will be effective. In such a case, however, there occurs an adverse effect that the particles with small particle sizes are evaporated.

In the present invention, the form of a powder to be fed into a combustion flame is recommended to be granular. More specifically, when a fine powder obtained by a liquid phase method such as the precipitation method or the like is processed by the spray granulation method, in which the spray-drier is a representative apparatus, the obtained powder is granular and can be controlled to have a small width of particle size distribution. Furthermore, by suitably setting the condition for the spray granulation method, the particle size of the granular powder can be nearly arbitrarily controlled. Consequently, when a granular powder thus obtained is fed into a combustion flame, the particle size distribution of the powder finally obtained can be made narrower.

The production method of spherical oxide powder of the present invention is based on the above described knowledge. That is, the present invention is characterized in that the method comprises a feeding step in which a granular powder composed of an oxide composition is fed into a combustion flame together with a carrier gas, a melting step in which the fed granular powder is melted in the combustion flame to obtain a melt, and a solidifying step in which the melt is moved and placed outside the combustion flame to be solidified.

In the present invention, for example, when the barium titanate ($BaTiO_3$) powder is finally obtained, the granular powder can be composed of a mixture containing the $TiO_2$ particles and $BaCO_3$ particles, in addition to the case where the granular powder is composed of only the $BaTiO_3$ particles. Namely, there are two cases for the preparation of a granular powder in the present invention: in one case, the granular powder is composed of the compound identical with the spherical oxide powder obtained through the solidifying process, and in the other case, the granular powder is composed of plural kinds of particles. The cases where the granular powder is composed of plural kinds of particles includes the case where the granular powder is composed of the particles of compounds and elemental simple substances, in addition to the case where the granular powder is composed of the particles of plural kinds of compounds. The state of the granular powder includes the two states; one is the state of dryness and the other is the state as a mixture with a slurry.

A specific target of the present invention is the dielectric material composed of composite oxides. By the way, a spherical oxide powder obtained in the present invention preferably has a mean particle size of 1 to 10 μm and a sphericity of 0.9 or above. More preferable mean particle size is 1 to 6 μm and more preferable sphericity is 0.95 or above.

In the present invention, as described above, a granular powder composed of plural different kinds of particles can be fed into a combustion flame. In this case, while the granular powder is melted in the combustion flame, the different kinds of particles, typically particles of different compounds react with each other, and finally the desired oxide powder can be formed. This process is an efficient process in which the spheroidization can be achieved. Accordingly, the present invention provides a production method of spherical oxide powder which method is characterized in that producing a powder, in which two or more than two kinds of particles, capable of finally constituting a desired oxide powder by a thermal reaction, are aggregated in a state of being in contact with each other, and making said powder produced to stay in a combustion flame for a prescribed period of time.

The present invention provides the following production apparatus suitable for the above described production methods of spherical oxide powder. Namely, the production apparatus of spherical powder of the present invention is characterized in that the production apparatus comprises a burner for generating a combustion flame, an in-process substance feeding means for feeding a in-process substance to said combustion flame, a chamber provided with an in-process substance transiting region through which the in-process substance, heat treated by the combustion flame, passes in a floating state, and a heating means for heating said in-process substance transiting region. The production apparatus of the present invention is characterized in that a heating means is provided to prevent the in-process substance, having been stayed in the combustion flame for a prescribed period of time, from abrupt decrease in temperature. The abrupt temperature decrease causes the following problems. The heating device in the present invention is provided with for the purpose of solving these problems.

(1) Formation of single crystal particles is difficult since crystals can not grow largely.

(2) A high temperature phase remains in a portion of a formed particle.

(3) Abrupt cooling makes the texture during solidification to remain in the structure of a particle.

(4) In the formation of the composite particles having such composite structures as core-shell structures and the like, the phase separation and the composition precipitation within the particles do not proceed to a sufficient extent owing to the abrupt cooling, and hence it is difficult to obtain the desired structure.

The heating means of the production apparatus according to the present invention can comprise a plurality of heating parts. In this case, when the temperatures of the plurality of heating parts are adjusted to be different from each other so as to decrease on going along the transit direction of the in-process substance, the in-process substance can be cooled slowly in the in-process substance transiting region. Additionally, the heating means is preferably equipped with a gas flow controlling means for controlling the gas flow in the in-process substance transiting region. Furthermore, when the heating means is equipped with the gas flow controlling means for controlling the gas flow in the in-process substance transiting region, the movement of the in-process substance in the in-process substance transiting region can be controlled. As for the gas flow controlling means, such a means that is provided with a gas feeding opening, capable of feeding the gas along an arbitrary direction, is applicable.

By the way, recently with the rapid increase of communication information, reduction in size and weight, and speedup of communication appliances are eagerly demanded. Particularly, the frequency band of the radio waves, for use in the cellular mobile communication such as car phones and digital cellular phones, and in the satellite communication falls in a high frequency band ranging from the megahertz band to the gigahertz band (hereinafter, referred to as "GHz band").

In the rapid development of the communication appliances being used, downsizing and high density mounting have been attempted for the cases, substrates, and electronic elements. For the purpose of further promoting the reduction in size and weight of the communication appliances for the high frequency bands, the materials for the substrates and the like used in communication appliances are required to be excellent (small in dielectric loss) in high frequency transmission properties in the GHz band.

The dielectric loss is proportional to the product of the frequency, the dielectric constant $\epsilon$ of the substrate, and the dielectric dissipation factor (hereinafter, represented by tan $\delta$). Accordingly, for the purpose of reducing the dielectric loss, it is necessary to reduce the tan $\delta$ of the substrate. In addition, the wavelength of an electromagnetic wave is contracted in a substrate by a factor of $1/\sqrt{\epsilon}$, and hence the larger is the dielectric constant $\epsilon$, the substrate size can be made the smaller.

From the above, the circuit boards for the downsized communication appliances, electronic appliances, and information appliances used in a high frequency band are required to have such material properties that the dielectric constant $\epsilon$ is high and tan $\delta$ is small.

As the materials used for such circuit boards, dielectric materials are used as inorganic materials, while fluororesins and the like are used as organic materials. The substrates made of dielectric materials are excellent in the properties of dielectric constant $\epsilon$ and tan $\delta$, but have drawbacks in dimension accuracy and machinability, and have a problem that the dielectric substrates are so brittle that they are easily chipped and cracked. On the other hand, the substrates made of organic materials such as resins and the like have the advantages of excellent moldability and machinability, and small tan $\delta$, but have a problem that the dielectric constants $\epsilon$ are small. Accordingly, recently, for the purpose of obtaining substrates having both advantages simultaneously thereof, composite substrates have been proposed which are formed as composite substances of organic materials and inorganic materials by mixing dielectric materials in resin materials (for example, see Japanese Patent No. 2617639, etc.).

Accompanying the advent of such composite substrates, those dielectric materials which are excellent in dispersion properties and packing properties for resin material are demanded. As described above, there are two factors, particle size and particle shape, for acquiring dispersion properties and packing properties for resin material.

In the above-mentioned Japanese Patent No. 2617639, made a proposal wherein titanium oxide particles having a high dielectric constant is selected as dielectric material, the surfaces of the titanium oxide particles are provided with an inorganic coating composed of inorganic hydroxides and/or inorganic oxides, and the dispersion properties for resin are acquired by dispersing the coated particles in a resin material.

A substrate made of the dielectric material described in Japanese Patent No. 2617639, however, has a problem that the tan $\delta$ in the high frequency (particularly, 100 MHz or above) band is large. In view of the tendency that in future the frequency band in use be changing over to the higher frequency bands, there is a demand for a composite dielectric material which can acquire a high dielectric constant $\epsilon$ and a low tan $\delta$, that is, a high Q value (here, Q is the reciprocal of tan $\delta$, $Q=1/\tan \delta$).

According to the investigations made by the present inventors, the spherical dielectric powder obtained by the above described production method of spherical oxide powder of the present invention is excellent in the dispersion properties and packing properties for resin material. Consequently, a composite dielectric material composed of the spherical dielectric powder and a resin material has been found to have excellent high frequency properties. In other words, the present invention provides a composite dielectric material characterized in that the composite dielectric material comprises a resin material and a spherical dielectric powder dispersed in the resin material which dielectric powder has a particle sphericity of 0.82 to 1, and the ratio between the 10% diameter of the powder and the 90% diameter of the powder is 30 or below. By making the particle sphericity to be 0.82 to 1 so as close to that of the true sphere, the dispersion properties and packing properties of the dielectric material for resin material are remarkably improved.

The dielectric powder in the present invention is preferably based on the $BaO-RO-TiO_2$ materials (R: a rare earth element, RO: a rare earth oxide). In addition, in the present invention, when the total content of a resin material and a dielectric powder is represented as 100 vol %, and the content of the dielectric powder is 30 vol % or above and smaller than 70 vol %, a high dielectric constant $\epsilon$ and an excellent Q value can be obtained in GHz band.

As described above, the dielectric powder in the present invention, the ratio between the 10% diameter of the powder and 90% diameter thereof is 30 or below. Namely, the particle size distribution of the powder is narrow. In addition to this, by making the mean particle size of the dielectric powder to fall within the range from 0.5 to 10 μm, the dispersion properties and packing properties of the dielectric material for resin material can be further improved. As for dielectric powder in the present invention, a spherical oxide powder subjected to a heat treatment for spheroidizing the dielectric powder, can be employed.

As the resin material in the present invention, the polyvinyl benzyl ether compounds are suitable. The polyvinyl benzyl ether compounds have such excellent electric properties that the dielectric constant $\epsilon$ is low and the Q value is high ($\epsilon=2.5$, $Q=260$) as compared with other resin materials. Accordingly, when the polyvinyl benzyl ether compounds are used as the resin materials in the present invention, composite dielectric materials excellent in dielectric properties can be obtained.

Any composite dielectric material of the present invention is small in dielectric loss even at 2 GHz so that it exhibits a high Q value. Specifically, at 2 GHz, the composite dielectric material can have a Q value higher than that of the resin material ($Q=1/\tan \delta$, tan $\delta$ being the dielectric dissipation factor).

In addition, the present invention provides a substrate wherein a dielectric powder is dispersed in a resin material, the ratio of between the 10% diameter and the 90% diameter is 30 or below in the dielectric powder, and the particle sphericity of the dielectric powder is 0.82 to 1. In this connection, a substrate in the present invention signifies a substrate which is a circuit board or a multi-layer board for use in mounting electric parts, or a substrate for use in packaging semiconductors for the purpose of housing semiconductor elements. A composite dielectric material of the present invention uses such a dielectric powder that is narrow in particle size distribution and high in sphericity, and hence its fluidity becomes high. Consequently, the composite dielectric material can be densely filled even in the peripheries of the patterns (pattern edges) formed on the substrate, and thus there can be obtained a substrate which is high in dielectric properties and also high in strength. Furthermore, when the total content of the resin material and the dielectric powder is represented as 100 vol %, and the content of the dielectric powder is made to be 30 vol % or above and smaller than 70 vol %, a substrate having a dielectric constant of 8 or above in a high frequency band of 2 GHz can be obtained. In addition, a substrate having a Q value of 300 or above can also be obtained in 2 GHz.

As the resin material in a substrate of the present invention, the polyvinyl benzyl ether compounds are suitable. The polyvinyl benzyl ether compounds have excellent electric properties as described above. In addition to this, the polyvinyl benzyl ether compounds are excellent in heat resistance and in chemical resistance, and simultaneously are characterized in that the water absorption is very low, and moreover the adhesion properties with a variety of materials are excellent. Thus, by using a polyvinyl benzyl ether compound as the resin material, there can be obtained a substrate which is low in water absorption and excellent in heat resistance and in chemical resistance.

In addition, in a substrate of the present invention, the dielectric powder is preferably based on the BaO—RO—TiO$_2$ materials (R: a rare earth element, RO: a rare earth oxide). In addition, the dielectric powder can be a spherical oxide powder subjected to a heat treatment for spheroidizing the dielectric powder.

Furthermore, the present invention provides a production method of a substrate suitable for use in the high frequency region. To be in more detail, by using the granules composed of an oxide composition, there is obtained a spherical oxide powder in which the ratio between the 10% diameter and the 90% diameter is 30 or below, the mean particle size is 0.5 to 10 μm, and the particle sphericity is 0.82 to 1. Then, the spherical oxide powder and a resin material are mixed together to obtain a mixture, and subsequently the mixture is subjected to the compressing to obtain a substrate. In this connection, when the total content of the resin material and the spherical oxide powder is represented as 100 vol %, the content of the spherical oxide powder is preferably 30 vol % or above and smaller than 70 vol %. Moreover, in the present invention, the spherical oxide powder is preferably a dielectric ceramic powder.

BRIEF DESCRIPTION OF THE DRAWINGS

FIG. 6 is a table showing the dielectric constants ε and Q values of Samples 2 to 5 measured in Example 4;

BEST MODE FOR CARRYING OUT THE INVENTION

Figure 1:
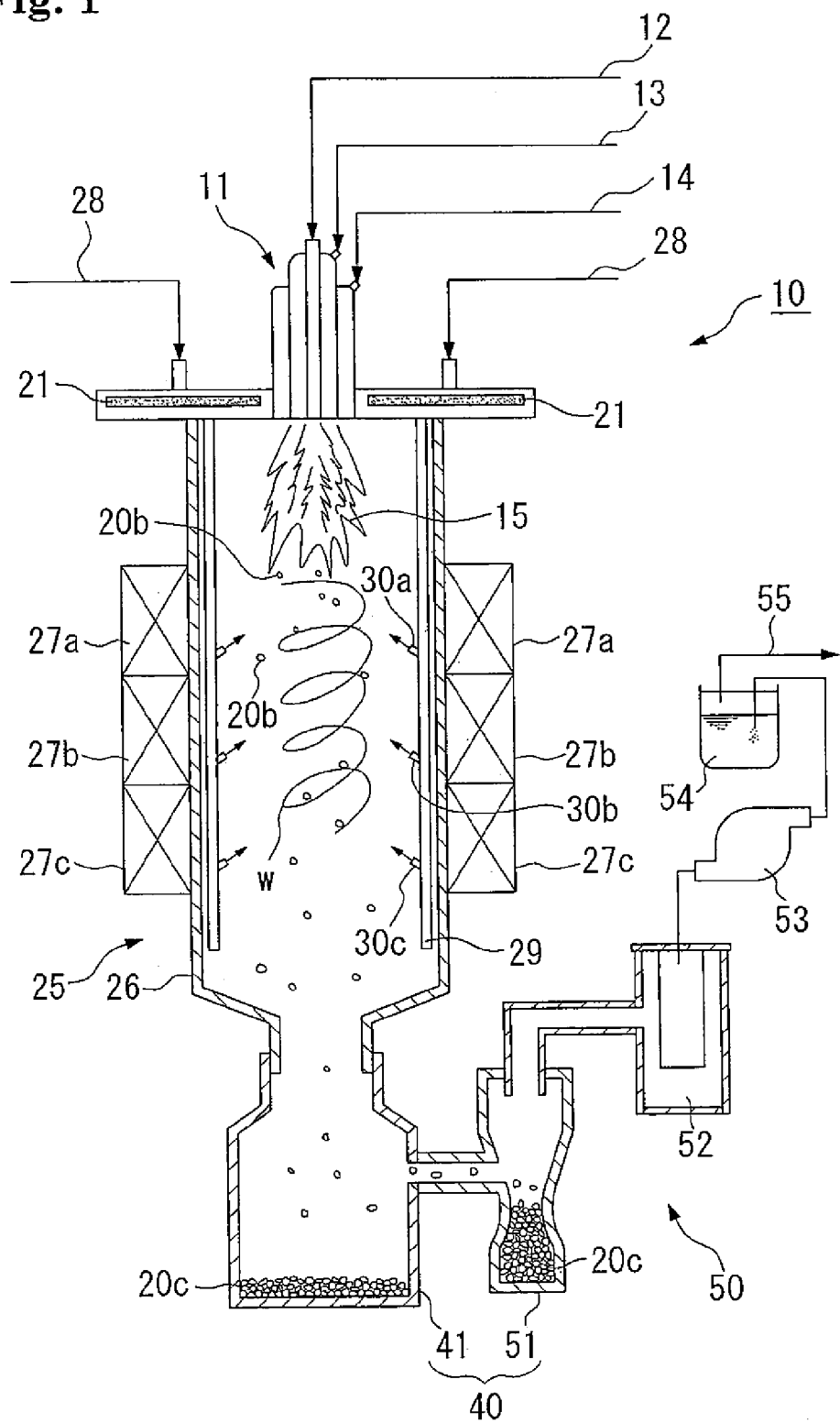
FIG. 1 is a sectional view showing an example of a production apparatus of spherical powder.

Description will be made below on the embodiment of the present invention.

The present invention relates to oxides. In the present invention, the oxide is a concept including composite oxides. Not limiting the oxides to be applied, the present invention can be applied widely to the dielectric materials and magnetic materials, etc. well known in the art.

As the dielectric materials, for example, those oxides based on barium titanate, lead titanate, strontium titianate, and titanium dioxide can be listed. As the magnetic materials, for example, Mn—Zn based ferrites, Ni—Zn based ferrites, Mn—Mg—Zn based ferrites, Ni—Cu—Zn based ferrites, and the like can be listed. In addition, the present invention is applicable to such iron oxides as $Fe_2O_3$ and $Fe_3O_4$.

The present invention is characterized in that granular powders are used as material powders. This is ascribed to the fact that the width of the particle size distribution, as described above, can be made narrow at the step of obtaining granular powders. Furthermore, the particle size can also be controlled.

As a typical method of obtaining granular powders, there is a spray granulation method which uses a spray nozzle. In the spray granulation method, a slurry is prepared for the purpose of spraying the starting material powder from the spray nozzle. The slurry can be obtained by adding a proper amount of the starting material powder to a solvent, and subsequently mixing by use of a mixing machine such as a ball mill, attriter, or the like. Water can be used as solvent, however, in order to increase the dispersion properties of the starting material, a dispersant such as ammonium polyacrylate A-30SL manufactured by Toa Gosei, Inc. is recommended to be added. A bonding agent for mechanically binding the starting material powders, such as PVA (polyvinyl alcohol), can also be added.

The slurry containing the material powder is sprayed by use of a spray nozzle, a revolving disc, or the like to form droplets. Here, the spray nozzle is a device for use in spraying the above mentioned slurry and a compressed gas, and there can be used a two-fluid nozzle or a four-fluid nozzle.

The slurry discharged from the spray nozzle together with the compressed gas is converted to fine particles to form mist. The droplet size in the mist can be controlled by the ratio between the slurry and the compressed gas. By controlling the droplet size, the particle size of the granules finally obtained can be controlled. By supplying the heat for drying the moisture during the process where the slurry in a mist state falls down freely, there can be obtained a powder from which the liquid component is dried and removed. The heat can be supplied by making the gas discharged from the spray nozzle to be a heated gas, or by feeding a heated gas into the mist atmosphere. For the purpose of drying, a gas heated to 100° C. or above can be used. The processes of spraying and drying with the spray nozzle are performed in a prescribed chamber. A powder obtained by the spray granulation method using a spray nozzle is usually a granular powder. The particle size of the granular powder, as described above, can be controlled by the ratio between the slurry and the compressed gas. Fine droplets can also be formed by making the droplets of the slurry to collide with each other.

The granular powder obtained as described above is fed into a combustion flame. The fed granular powder stays in the combustion flame during a prescribed period of time. During that stay, the granular powder undergoes a heat treatment. Specifically, the granular powder is melted to form spherical particles. When the granular powder is composed of two or more than two kinds of particles, the particles react with each other so as to finally form the desired oxide. The granular powder being fed into the combustion flame can be fed in a dry state, and additionally it can also be fed in a wet state as a slurry containing the granular powder.

As for the combustion gas for obtaining the combustion flame, there is no particular restrictions, and such gases well known in the art as LPG, hydrogen, acetylene, or the like can be used. In the present invention, it is necessary to control the oxidation degree of the combustion flame, since oxides are processed in the present invention. For the purpose of controlling the oxidation degree, it is desired to supply an appropriate amount of oxygen to the combustion gas. When LPG is used as the combustion gas, the oxygen amount of five times the supply amount of LPG is equivalent to the LPG amount, when acetylene is used as the combustion gas, the oxygen amount of 2.5 times the supply amount of acetylene is equivalent to the acetylene amount, and when hydrogen is used as the combustion gas, the oxygen amount of 0.5 times the supply amount of hydrogen is equivalent to the hydrogen amount. By appropriately setting the supply amount of oxygen, with reference to these oxygen amounts, the oxidation degree of the combustion flame can be controlled. The flow rates of these combustion gases can be appropriately determined according to the size of the burner.

The temperature of a combustion flame is varied by the kind and amount of the combustion gas, the ratio thereof to the oxygen amount, the feeding rate of the granular powder, and the like. When LPG is used as the combustion gas, the temperatures up to about 2100° C. can be obtained, and when acetylene is used as the combustion gas, the temperatures up to about 2600° C. can be obtained.

As for the technique of feeding a granular powder into a combustion flame, there is no restrictions as far as the granular powder is allowed to enter the flame. In addition to this, the granular powder is preferably fed along the flame axis from the burner, in order to prolong the transit time of the granular powder passing through the flame. Accordingly, it is preferable that the granular powder is adjusted not to leak out of the flame before the granular powder reaches the flame bottom.

The feeding of the granular powder is made by using such a carrier gas as oxygen or the like. In the present invention, a granular powder having a satisfactory fluidity is used so that the conveyance performance by the carrier gas is excellent. Incidentally, in a case where a pulverized powder is delivered by using a carrier gas, the irregularity in shape and the wide width of the size distribution of a pulverized powder cause a poor fluidity and an unsatisfactory conveyance performance. Needless to say, it is necessary to increase the amount of a carrier gas for the purpose of increasing the feeding amount of a granular powder, and in the case where oxygen is used as the carrier gas, it is necessary to reduce the amount of oxygen which is the supporting gas, and to adjust the mixing ratio between the carrier gas and oxygen.

FIG. 1 is a sectional view showing an example of a production apparatus suitable for the production method of spherical oxide powder of the present invention. The production apparatus 10 has a burner 11, a chamber 25, a processed powder collecting means 40, and a gas discharge means 50.

The burner 11 has a water-cooled triple pipe structure, and the individual regions are respectively connected to a granular powder feeding pipe 12, a combustion gas feeding pipe 13, and an oxygen feeding pipe 14.

The chamber 25 is formed of a highly heat-resistant material such as alumina, and a water-cooled jacket 21 holding the burner 11 is arranged at the top of a cylindrical body 26. The water-cooled jacket 21 serves to adjust the generated combustion flame 15 and to prevent the production apparatus 10 from being damaged by the heat of the combustion flame 15. For the purpose of forming the heating region inside the cylindrical body 26, the first heating part 27a, the second heating part 27b, and the third heating part 27c are arranged, successively in a downward-pointing manner, around the circumference of the cylindrical body 26. For heating in the heating parts 27a, 27b, and 27c, there can be used a heating method well known in the art such as a heating by electric power, a heating by burning gas, or a radio-frequency heating. Among these heating methods, the heating by electric power is preferable which can easily control the atmosphere inside the furnace.

Furthermore, a gas feeding path 29 connected to a gas feeding pipe 28 is arranged on the inside wall of the cylindrical body 26. The gas feeding path 29 is equipped with gas feeding openings 30a, 30b, and 30c for feeding the gas into the interior of the cylindrical body 26. The bottom of the cylindrical body 26 is open and connected to a collecting vessel 41 for collecting the processed powder.

As for a gas discharge means 50, a cyclone 51, a filter device 52, an air pump 53, a cleaning vessel 54, and a discharge pipe 55 are connected to the side surface of the collecting vessel 41 for the purpose of discharging the gas coming from the cylindrical body 26 in a harmless state. Here, in the present embodiment, the collecting vessel 41 and the cyclone 51 constitute the processed powder collecting means 40. As will be described later in detail, in the present embodiment, for the purpose of increasing the time of the in-process powder 20b staying in the heating region, there is formed a circling gas flow w circling inside the cylindrical body 26. Owing to the circling gas flow, 60 to 90% of the in-processed powder 20b is collected in the cyclone 51.

In a specific production method of spherical powder using the production apparatus 10, while feeding such a combustion gas as LPG or the like from the combustion gas feeding pipe 13 of the burner 11 and oxygen from the oxygen feeding pipe 14, the combustion gas is ignited to generate the combustion flame 15 directing downward.

Then, the granular powder 20a (not shown in the figure) is fed from the granular powder feeding pipe 12 together with the carrier gas. The granular powder 20a is fed into the combustion flame 15 formed with the burner 11.

In the combustion flame 15, different portions have different temperatures as such that, for example, the temperatures of the central portion and the peripheral portion are different. Accordingly, depending on the kind of the granular powder 20a and the processing type, the size of the combustion flame 15 and the like are adjusted, and simultaneously the feeding location of the granular powder 20*a* is also adjusted. By the way, when the granular powder 20*a* is melted by the heat of the combustion flame 15 to obtain the spherical processed powder, the temperature of the combustion flame 15 is adjusted to be a temperature higher than the melting point of the granular powder 20*a*.

The granular powder 20*a* having thus stayed in the combustion flame 15 for a prescribed period of time is melted or modified chemically or physically by the heat of the combustion flame 15, and falls down within the chamber 25. The granular powder 20*a* having passed through the combustion flame 15 becomes the in-process powder 20*b*.

Around the circumference of the chamber 25, the first heating part 27*a*, the second heating part 27*b*, and the third heating part 27*c* are arranged, successively in a downward-pointing manner from the burner 11 to the collecting vessel 41, that is, along the traveling direction of the in-process powder. A heating region is formed inside the chamber 25 by the first to third heating parts 27*a*, 27*b*, and 27*c*.

In the heating region, the first heating part 27*a* is set at a temperature lower than that of the location in the combustion flame 15 through which location the granular powder 20*a* passes. Furthermore, the second heating part 27*b* is set at a temperature lower than that of the first heating part 27*a*, and the third heating part 27*c* is set at a temperature lower than that of the second heating part 27*b*. Consequently, the internal temperature of the cylindrical body 26 is made to decrease gradually from the first heating part 27*a* to the third heating part 27*c*.

While the in-process powder 20*b* having passed through the combustion flame 15 falls down, in a floating state, inside the cylindrical body 26 of the chamber 25, the in-process powder 20*b* is exposed successively to the temperatures corresponding to the respective heating parts 27*a*, 27*b*, and 27*c*, during the transit process through the first to the third heating parts 27*a*, 27*b*, and 27*c*. Thus, the granular powder 20*a*, being in a high temperature melted state through staying in the combustion flame 15 for a prescribed period of time, is slowly cooled down without any abrupt decrease in temperature.

Figure 2:
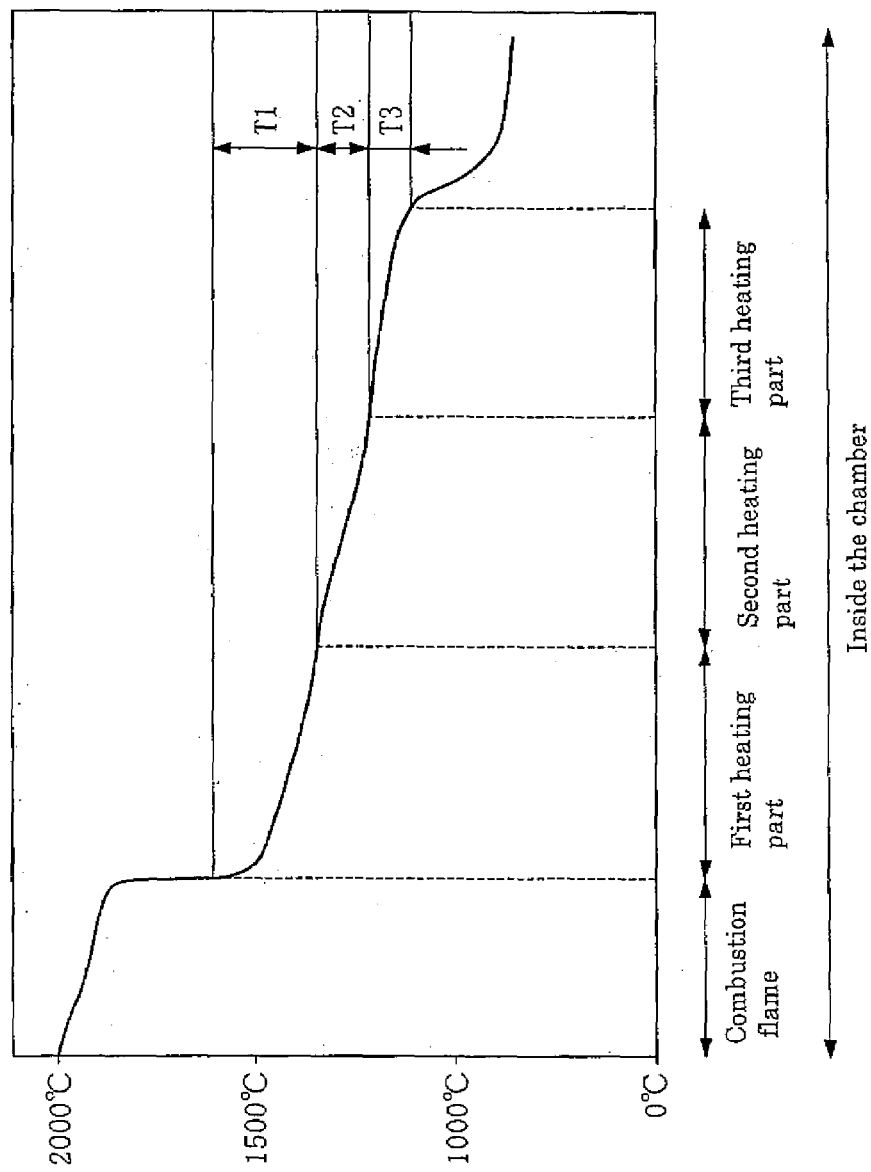
FIG. 2 is a graph showing an example of a temperature variation in a powder in the case where the powder was processed by using the apparatus shown in FIG. 1.
Figure 3:
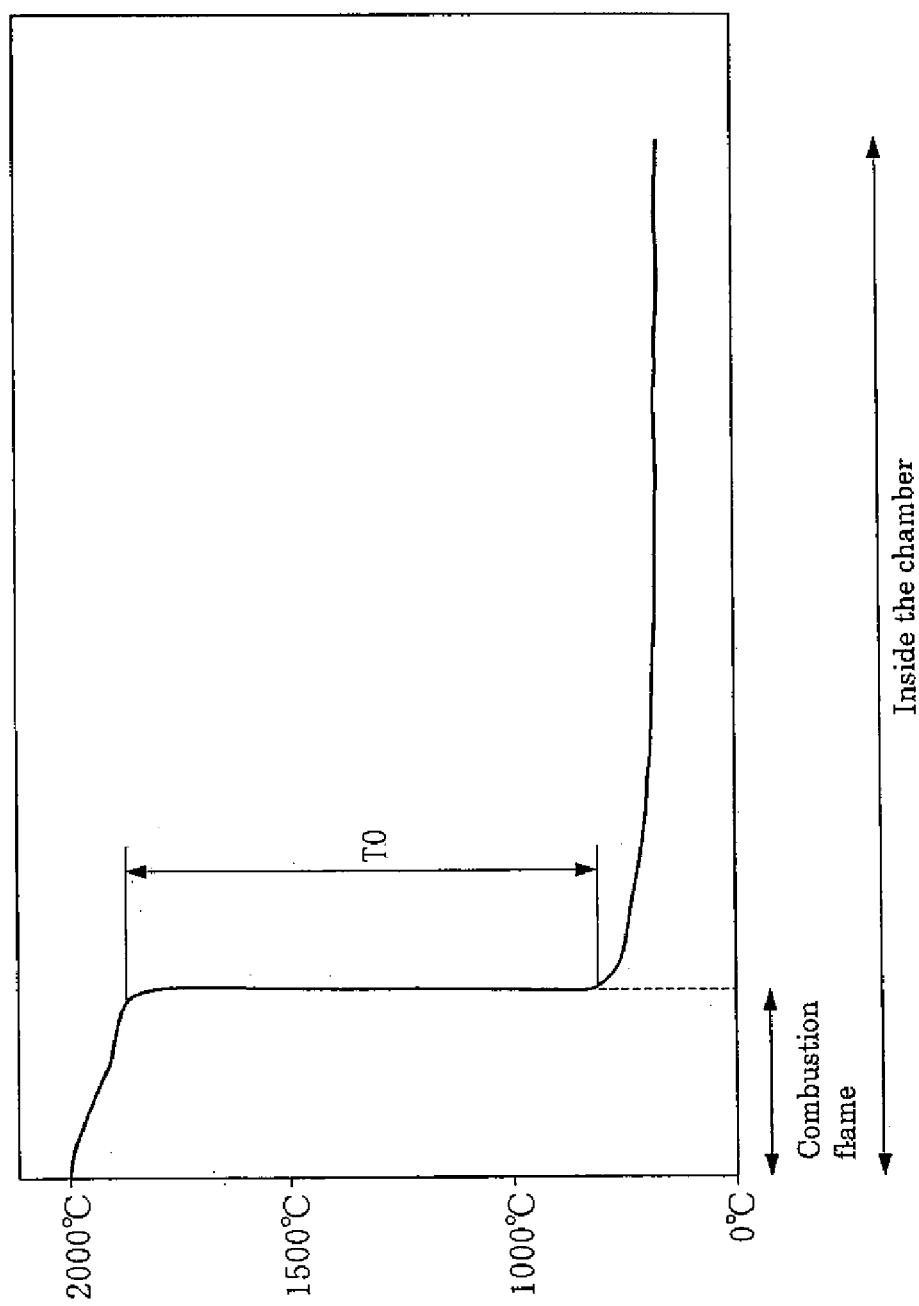
FIG. 3 is a graph showing an example of a temperature variation in a powder in the case where the powder was processed by using a production apparatus provided with no such a heating region as in the production apparatus of the present invention.

FIG. 2 is a graph showing an example of a temperature variation in a powder in a case where the powder was processed by using the production apparatus 10 of the present embodiment, while FIG. 3 is a graph showing an example of a temperature variation in a powder in a case where the powder was processed by using a production apparatus which was not provided with such a heating region as in the production apparatus 10. In FIG. 2, the temperature of the in-process powder 20*b*, heated to a high temperature by the combustion flame 15, is decreased gradually in such a manner as to a temperature T1 in the first heating part 27*a*, to a temperature T2 in the second heating part 27*b*, and to a temperature T3 in the third heating part 27*c*. For example, when the barium titanate powder is processed, by arranging the first heating part 27*a*, the second heating part 27*b*, and the third heating part 27*c* as described above, the temperature of the heating region can be maintained in the range from 1200° C. or above and 1800° C. or below, and preferably 1300° C. or above and 1600° C. or below, and hence the abrupt temperature decrease of the powder, following the movement thereof out of the combustion flame 15, can be avoided. On the contrary, when processed without arranging the heating region, as FIG. 3 shows, an abrupt temperature decrease of the powder of 1000° C. or more (the temperature difference of T0) occurs immediately after the movement thereof out of the combustion flame 15.

By arranging the transit region, in continuation with the burner 11, in which region the temperature decreases gradually along the traveling direction of the in-process powder 20*b*, the abrupt temperature decrease can be prevented which occurs when the in-process powder 20*b* is not heated but is left as it is cooled.

The heating temperatures set for the respective heating parts 27*a*, 27*b*, and 27*c* are varied depending on the kind of the powder and the object of the processing. The temperature set for the first heating part 27*a* is preferably in the neighborhood of the melting point of the granular powder 20*a*. The difference between the temperatures set for the first heating part 27*a* and the second heating part 27*b* and the difference between the temperatures set for the second heating part 27*b* and the third heating part 27*c* are each preferably about 100 to 300° C. In the third heating part 27*c* which is the last heating part in the heating region, the temperature is preferably set so as to avoid the quality alteration of the in-process powder 20*b*. When the melting of the granular powder 20*a* by the combustion flame 15 is aimed at, the temperature of the first heating part 27*a* is preferably set to a temperature in the neighborhood of the melting point of the granular powder 20*a*.

In the present embodiment, for the purpose of preventing the abrupt temperature decrease of the powder, it is preferable to have a means which enables the powder to stay in the heating region for a long period of time. As a specific means for that purpose, a gas feeding means is arranged in the heating region of the production apparatus 10. The gas, being fed from a gas feeding pipe 28, passes through a gas feeding path 29, and is ejected from respective gas feeding openings 30*a*, 30*b*, and 30*c* into the interior of the cylindrical body 26. By ejecting the gas in this way, the in-process powder 20*b* is prevented from falling down in a straightway into the collecting vessel 41, so that the in-process powder 20*b* can be prevented from being abruptly cooled.

As shown in FIG. 1, for example, by inclining the gas ejection direction to the burner 11, a circling gas flow w circling inside the cylindrical body 26, along the direction intersecting the falling direction of the in-process powder 20*b*, can be formed from the gas flow generated by the combustion flame 15 and the gas flows from the gas feeding openings 30*a*, 30*b*, and 30*c*. The in-process powder 20*b* falls down into the processed powder collecting means 40 (collecting vessel 41 and cyclone 51), while circling inside the cylindrical body 26 along with the circling gas flow w, and hence it takes time to fall down so that the time of the in-process powder 20*b* staying in the heating region is increased. Consequently, the in-process powder 20*b* falls down, while being reliably cooled down in the heating region to the temperatures of the respective heating parts 27*a*, 27*b*, and 27*c*, and hence abrupt cooling down is prevented more reliably.

In such a way as above, the time of the in-process powder 20*b* staying in the heating region, achieved by feeding the gas into the interior of the cylindrical body 26, is varied depending on the temperature and the kind of the powder, and is preferably about 3 to 20 sec, and more preferably about 5 to 15 sec. The gas used in this processing can be selected by considering the reactivity with the in-process substance, etc. and it is for example $N_2$, $O_2$, Ar, air, or the like.

As described above, the in-process powder 20*b*, which has been heated to a high temperature by staying in the combustion flame 15 for a prescribed period of time, is slowly cooled by passing through the heating region, without being abruptly cooled immediately after passing through the combustion flame 15. In this way, the in-process powder 20b, falling down inside the cylindrical body 26 to be cooled, is housed in the processed powder collecting means 40.

The processed powder 20c, collected in the processed powder collecting means 40, can be obtained as a processed powder having excellent properties to meet the object of the processing as being a powder composed of dense particles of high crystallinity, single crystal particles, spherical particles (high sphericity particles), or the like.

Specifically, in the present embodiment, the powder having passed through the combustion flame 15 is made to pass through the heating region and thereby is made to be cooled slowly, that is, prevented from being abruptly cooled, so that particles having single crystal structure can be easily obtained, without applying any post-processing (annealing processing, and the like).

A mean particle size of a powder obtained in the present embodiment is about 0.1 to 50 μm, and particularly particles about 1 to 10 μm in mean particle size can be obtained.

Furthermore, in the present embodiment, a powder having a sphericity of 0.9 to 1 can be obtained, and moreover, a powder having a sphericity of 0.95 to 1 can be obtained. When the sphericity is 0.9 or above, a processed powder 20c tends to be uniformly dispersed in other materials. Here, "spherical" includes polyhedrons very close to a true sphere, in addition to a true sphere with smooth surface. Specifically, there is also included a polyhedron particle, having an isotropic symmetry and being enclosed by stable crystal surfaces, as represented by the Wulff model, and in addition having a sphericity close to 1. Even those particles which have fine concavities and convexities on the surface or elliptic sections fall under the category of being "spherical" in the terminology of the present invention, when the sphericity falls within the range 0.9 to 1. Here, the "sphericity" is the practical sphericity of Wadell, that is, the sphericity of a particle is the ratio between the diameter of a circle which has the same area as the projected area of the particle and the diameter of the minimum circle circumscribing the projected image of the particle.

Additionally, in the present embodiment, there can be easily obtained a processed powder composed of particles having such a composite particle structure as core-shell structure or the like, through appropriate selection of the material powder. In the present embodiment, the in-process powder undergoes slow cooling, and hence the phase separation can occur within a particle. As an example of those particles which have composite particle structure, there can be cited a core-shell structure particle obtained by processing a suspension of silver nitrate with silica particles dispersed therein.

In addition, there can be obtained products having excellent properties, and materials and parts having special structure and functions, by using the processed powder 20c in combination, as mixtures, or the like with other materials. In particular, as will be described later, there can be obtained substrates, filters, and the like suitable for use in the high frequency band.

In the above described production apparatus 10 shown in FIG. 1, the heating region is composed of the first to third heating parts, 27a, 27b, and 27c, but the heating region may be made up only by the first heating part 27a, or alternatively may be constituted by more than three heating parts. The number of the heating parts arranged is appropriately adjusted depending on the kind of the powder to be processed and the type of the purposed processing. The heating region is not limited to that composed of the heating parts 27a, 27b, and 27c as shown in FIG. 1, but for the heating region, there can be used such an alternative heating unit as a unit in which a heated gas is injected into the interior of the cylindrical body 26, or the like, as far as it can yield a temperature gradient making the temperature decrease along the falling direction of the in-process powder 20b, that is, the direction from the burner 11 to the processed powder collecting means 40. Sometimes, a positive heating by use of the first to third heating parts 27a, 27b, and 27c is not performed, depending on the purposed temperature gradient. Furthermore, through regulating the gas flow conditions in the cyclone 51, for example, the condition that the directions of discharge from the cylindrical body 26 and the collecting vessel 41 are made to lie on a circumferential direction, and the like, the circling gas flow w is generated inside the cylindrical body 26 without feeding the gas from the gas feeding openings 30a, 30b, and 30c, and thus the in-process powder 20b can be prevented from being abruptly cooled. Depending on the particle size distribution of a spherical powder, the processed powder 20c in the collecting vessel 41 and that in the cyclone 51 may be collected jointly by connecting the collecting vessel 41 and the cyclone 51 with a pipe.

Now, description will be made on a case where a dielectric powder is selected as a material and the dielectric powder is dispersed in a resin to produce a composite dielectric material and a composite substrate suitable for use in the high frequency band.

As described above, since the dispersion properties and packing properties for resin material are improved by making the particle shape to be spherical, the dielectric powder is beforehand converted to a spherical powder by use of the production apparatus 10 shown in FIG. 1. Specifically, the dielectric powder is converted to a granular powder by use of, for example, the above mentioned method (the spray granulation method), and is subsequently charged into the production apparatus 10. Then, the time of staying in the combustion flame 15 for the granular powder and the like are adjusted so as to finally obtain a dielectric powder having such a particle shape of sphericity 0.82 to 1.0 as is close to a true sphere.

As a dielectric powder, those oxides based on barium titanate, lead titanate, strontium titianate, titanium dioxide, and the like, as described above, can be used. Among these, the dielectric powders based on barium titanate are preferable, and particularly, a paradielectric powder based on $BaO$—$RO$—$TiO_2$ (R: a rare earth element, RO: a rare earth oxide) and exhibiting a tungsten bronze structure shows satisfactory dielectric properties in the high frequency band and hence is preferable. Here, the rare earth element R refers to one or more selected from the rare earth elements (La, Ce, Pr, Nd, Sm, Eu, Gd, Tb, Dy, Ho, Er, Yb, and Lu) inclusive of Y. Among these, Nd is an abundant resource and relatively inexpensive, and hence it is preferable to select Nd as main component for the rare earth element R.

When a dielectric powder based on $BaO$—$RO$—$TiO_2$ is used as a dielectric powder, it is preferable that the blending composition is such that BaO: 6.67 to 21.67 mol %, RO: 6.67 to 26.67 mol %, and $TiO_2$: 61.66 to 76.66 mol %. In addition, the oxides of Bi, Mn, Zr, Cr, Co, Ta, Ge, Li, B, Mg, and the like may be appropriately added to the composition based on a $BaO$—$RO$—$TiO_2$ material. By adding Bi, the temperature stability is improved, and simultaneously the dielectric constant is also improved. In addition, by adding Mn, a high Q value can be obtained. Furthermore, Zr, Cr, Co, Ta, Ge, Li, B, and Mg are effective for improvement of the temperature stability.

When a composite dielectric material is obtained by mixing a dielectric powder with a resin, the mean particle size of the dielectric powder is adjusted to be 0.5 to 10 μm. When the mean particle size of the dielectric powder is smaller than 0.5 μm, it is difficult to obtain high dielectric properties, in particular, to obtain a dielectric constant $\epsilon$ of 8 or above at 2 GHz. In addition, in a case where the mean particle size of the dielectric powder is so smaller than 0.5 μm, there occurs such an inconvenience that the kneading with the resin is not easy, and in addition, the handling becomes cumbersome as such that the particles of the dielectric powder aggregate and accordingly a non-uniform mixture is formed, and the like.

On the other hand, when the mean particle size of the dielectric powder exceeds 10 μm, the dielectric properties are satisfactory, but there occurs a problem that the pattern formation becomes so tough that it is difficult to obtain a thin and flat substrate. Consequently, the mean particle size of the dielectric powder is made to be 0.5 to 10 μm. The preferable mean particle size of the dielectric powder is 1 to 6 μm, and the more preferable mean particle size is 3 to 5 μm. By making the mean particle size of the dielectric powder 0.5 to 10 μm, it becomes possible to obtain a dielectric constant $\epsilon$ of 8 or above and a Q value of 300 or above in a high frequency region of 2 GHz as well.

For the purpose of uniformly distributing the dielectric powder in the resin, it is effective to use the dielectric powder in which the particle size distribution is narrow and the particle size is even. A guideline for the particle size distribution and particle size is that the ratio between the 10% diameter and the 90% diameter is 30 or below, more preferably 20 or below, and further more preferably 15 or below.

By using the above described method and production apparatus 10, a dielectric powder with the sphericity of 0.82 to 1 can be obtained, and further a dielectric powder with the sphericity of 0.9 to 1 can be obtained. When a dielectric powder with the sphericity of 0.82 or above is used, it becomes easy to disperse the dielectric powder uniformly in a resin.

Here, the definition of "spherical" is as described above. In the present invention, when two or more than two particles are bonded by fusion, the individual particles are regarded as one particle for the calculation of the sphericity. When there is a protrusion, a similar treatment is made.

In a composite dielectric material of the present invention, when the total content of a dielectric powder and a resin is represented as 100 vol %, the content of the dielectric powder is 30 vol % or above and smaller than 70 vol %. When the content of the dielectric powder is smaller than 30 vol % (the content of the resin exceeds 70 vol %), the dimension stability as a substrate is lost, and the dielectric constant $\epsilon$ is decreased. Namely, no appreciable effect of containing dielectric powder is found. On the other hand, when the content of the dielectric powder is 70 vol % or above (the content of the resin is 30 vol % or below), the fluidity is extremely degraded when press molded, so that no dense molded product can be obtained. As a result, water invasion or the like becomes easy, leading to degradation of the electric properties. As compared to the case where no dielectric powder is added, sometimes the Q value is largely decreased. Consequently, the content of the dielectric powder is set to be 30 vol % or above and smaller than 70 vol %. The preferable content of the dielectric powder is 40 to 65 vol %, and the more preferable content of the dielectric powder is 45 to 60 vol %. The optimal content of the dielectric powder varies according to the substrate pattern shape in such a way that the preferable content of the dielectric powder is about 35 to 45 vol % when the substrate pattern shape is relatively fine.

Since as described above the dielectric powder of the present invention is spherical and the particle size distribution thereof is narrow, the dispersion properties for resin are satisfactory even when the content of the dielectric powder is set to be 40 vol % or above, and furthermore 50 vol % or above, and the dielectric powder can be filled in without degrading the fluidity of the resin material. Accordingly, when a dielectric powder of the present invention is mixed with a resin material, and a substrate is produced by use of the mixture, the filled-in amount of the dielectric powder is improved as compared with the case where pulverized powder is used, and as a result a substrate having a high dielectric constant $\epsilon$ can be obtained.

On the contrary, when there is used a non-spherical dielectric powder such as a pulverized powder prepared by a conventional method, the fluidity of the resin material is deteriorated when the content of the dielectric powder in a substrate becomes about 40 vol %, and hence it is very difficult to make the content of the dielectric material in a substrate 45 vol % or above. Granted that the content of the dielectric powder in a substrate is permitted to be 45 vol % or above, it is difficult for the dielectric powder to fill in the pattern edges and the like in producing a substrate, and consequently there is obtained a substrate having voids in some portions thereof and accordingly having a low strength.

Now, description will be made on the resin material in the composite dielectric material of the present invention. As the resin material, organic polymer resins are preferable. The organic polymer resin is preferably a heat-resistant and low-dielectric-property polymer material which is a resin composite composed of one or more kinds of resins with the weight-average absolute molecular weight of 1000 or above, and in which the sum of the number of the carbon atoms and the number of the hydrogen atoms is 99% or above in ratio, and a part of the resin molecules or the whole resin molecules are chemically bonded to each other. By using an organic polymer resin having such a constitution as above, there can be obtained a composite dielectric material having a high dielectric constant $\epsilon$ and a high Q value in a high frequency region.

As described above, a heat-resistant and low-dielectric-property polymer material, made of a resin composite with the weight-average absolute molecular weight of 1000 or above, is used for the purpose of attaining sufficient strength, adherence to metal, and heat resistance. With a weight-average absolute molecular weight smaller than 1000, there occur insufficiencies in mechanical properties and heat resistance properties.

The reason why the sum of the number of the carbon atoms and the number of the hydrogen atoms is made to be 99% or above in ratio is that the chemical bonds present in the polymer material are made to be non-polar bonds, and thereby it becomes easy to obtain a high Q value. On the other hand, the Q value becomes small, when the sum of the number of the carbon atoms and the number of the hydrogen atoms is smaller than 99% in ratio, in particular, when the number of the contained atoms forming polar molecules such as oxygen atoms and nitrogen atoms is larger than 1% in ratio.

The weight-average absolute molecular weight is particularly preferably 3000 or above, and furthermore preferably 5000 or above. In this connection, there is no particular limit to the upper limit for the weight-average absolute molecular weight, but usually the upper limit is about ten millions.

As specific examples of the above described organic polymer resins, there can be listed homopolymers and copolymers (hereinafter, sometimes referred to as (co)polymers) of non-polar α-olefins such as low density polyethylene, ultra low density polyethylene, superultra low density polyethylene, high density polyethylene, low molecular weight polyethylene, ultra high molecular weight polyethylene, ethylene-propylene copolymers, polypropylene, polybutene, poly-4-methylpentene, and the like; (co)polymers of conjugated diene monomers such as butadiene, isoprene, pentadienes, hexadienes, heptadienes, octadienes, phenylbutadienes, diphenylbutadienes, and the like; and (co)polymers of carbon-ring containing vinyl monomers such as styrene, nuclear substituted styrenes such as methylstyrenes, dimethylstyrenes, ethylstyrenes, isopropylstyrenes, chlorostyrenes, α-substituted styrenes such as α-methylstyrene, α-ethylstyrene, divinylbenzenes, vinylcyclohexanes, and the like.

Figures 7, 8:
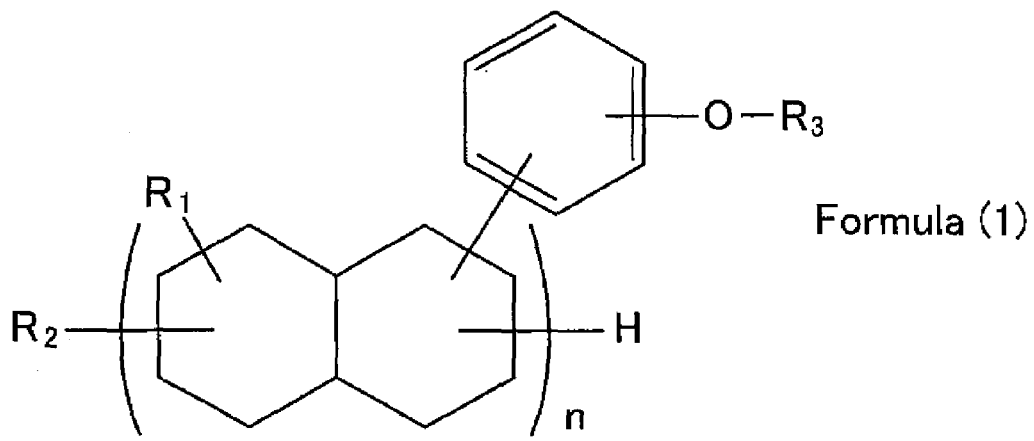
FIG. 7 is a figure showing the chemical formula of the polyvinyl benzyl ether compounds.
FIG. 8 is a table showing the specific combinations of $R_1$ and the like in the compounds represented by formula (1) given in FIG. 7.

As a resin used in the present invention, the polyvinyl benzyl ether compounds are particularly preferable. As the polyvinyl benzyl ether compounds, those compounds represented by formula (1) shown in FIG. 7 are preferable.

In formula (1), $R_1$ represents a methyl group or an ethyl group. $R_2$ represents a hydrogen atom or a hydrocarbon group having 1 to 10 carbon atoms. The hydrocarbon groups represented by $R_2$ are an alkyl group, an aralkyl group, an aryl group, and the like, each of which groups may contain substituents. The alkyl group is a methyl group, an ethyl group, a propyl group, a butyl group, or the like, the aralkyl group is a benzyl group or the like, and the aryl group is a phenyl group or the like.

$R_3$ represents a hydrogen atom or a vinylbenzyl group, the hydrogen atom stems from a starting compound for synthesis of the compound of formula (1), and the molar ratio of the hydrogen atom to the vinylbenzyl group is preferably 60:40 to 0:100, and more preferably 40:60 to 0:100.

n is a number of 2 to 4.

By making the molar ratio of the hydrogen atom of $R_3$ to the vinylbenzyl group of $R_3$ to fall within the above ranges, the curing reaction when obtaining a dielectric compound can be proceeded to a sufficient extent, and satisfactory dielectric properties can be obtained. On the contrary, when the unreacted compound in which $R_3$ is a hydrogen atom is increased in content, the curing reaction does not proceed to a sufficient extent, and no satisfactory dielectric properties can be obtained.

Specific examples for the combination of $R_1$ and the like in the compound represented by formula (1) are shown in FIG. 8, the combination is not limited to these examples.

The compound represented by formula (1) is obtained by reacting a polyphenol with $R_3$=H in formula (1) and a vinylbenzyl halide. As for the details of the reaction, the descriptions in Japanese Patent Laid-Open No. 9-31006 can-be referred to.

The polyvinyl benzyl ether compounds of the present invention may be used each alone or in combination of two or more kinds of compounds thereof. A polyvinyl benzyl ether compound of the present invention may be used alone in a polymerized form as a resin material, or may be used as polymerized with other monomers, or furthermore can be used in combination with other resins.

As polymerizable monomers, there can be listed, for example, styrene, vinyltoluenes, divinylbenzenes, divinylbenzyl ethers, allyl phenol, allyloxy benzenes, diallyl phthalates, acrylic acid esters, methacrylic acid esters, vinyl pyrrolidones, and the like. As for the blending ratios for these monomers, the blending ratio is about 2 to 50 mass % to a polyvinyl benzyl ether compound.

As resins usable in combination, there are thermosetting resins such as vinyl ester resins, unsaturated polyester resins, maleimide resins, polycyanate resins of polyphenols, epoxy resins, phenol resins, vinylbenzyl compounds and the like; and thermoplastic resins such as polyether imide resins, polyether sulfones, polyacetals, resins based on dicyclo pentadienes. As for the blending ratios for these resins, the blending ratio is about 5 to 90 mass % to a polyvinyl benzyl ether compound of the present invention. Among these resins, preferable resin is at least one selected from a group consisting of vinyl ester resins, unsaturated polyester resins, maleimide ester resins, polycyanate resins of polyphenols, epoxy resins, and the mixtures of these resins.

The polymerization and curing of either the polyvinyl benzyl ether compounds themselves of the present invention, or the thermosetting resin composites containing these compounds and other monomers or thermosetting resins, can be performed by a method well known in the art. The curing can be performed either in the presence or in the absence of a curing agent. As a curing agent, there can be used a radical polymerization initiator well known in the art such as benzoyl peroxide, methyl ethyl ketone peroxide, dicumyl peroxide, t-butyl perbenzoate, or the like. The usage amount of an initiator is 0 to 10 mass parts to 100 mass parts of a polyvinyl benzyl ether compound.

The curing temperature is varied depending on whether a curing agent is used and according to the type of the curing agent used, and it is 20 to 250° C., and preferably 50 to 250° C. for a sufficient curing.

For curing regulation, hydroquinone, benzoquinone, copper salts, and the like may be blended.

A reinforcing material can be added to a resin of the present invention. A reinforcing material is effective in improving the mechanical strength and the dimension stability, and hence usually a prescribed amount of a reinforcing material is added to the resin in producing a circuit board.

As the reinforcing materials, there can be listed fibrous reinforcing materials or plate-like or granular non-fibrous reinforcing materials. Among the fibrous reinforcing materials, here can be listed inorganic fibers such as glass fiber, alumina fiber, aluminum borate fiber, ceramics fiber, silicon carbide fiber, asbestos fiber, gypsum fiber, brass fiber, stainless fiber, steel fiber, metal fibers, magnesium borate whisker or fiber thereof, potassium titanate whisher or fiber, zinc oxide whisker, boron whisker fiber, and the like; and carbon fiber, aromatic polyamide fibers, aramide fibers, polyimide fibers, and the like. When a fibrous reinforcing material is used, there can be adopted a so-called impregnation method described in Japanese Patent Laid-Open No. 2001-187831. Namely, the point is that a fibrous reinforcing material molded in a sheet shape is immersed in a coating vessel in which the dielectric powder and the resin are mixed to prepare a slurry.

As the non-fibrous reinforcing materials, there can be listed needle-like, plate-like, or granular reinforcing materials which are silicates such as wollastonite, sericite, kaolin, mica, clay, bentonite, asbestos, talc, alumina silicate, pyrophyllite, montmorillonite, and the like; molybdenum disulfide, alumina, silicon chloride, zirconium oxide, iron oxides;

carbonates such as calcium carbonate, magnesium carbonate, dolomite, and the like; sulfates such as calcium sulfate, barium sulfate, and the like; calcium polyphosphate, graphite, glass bead, glass microballoon, glass flake, boron nitride, silicon carbide, and silica. These materials may be hollow. When a non-fibrous reinforcing material is used, it only has to be added to a resin.

These reinforcing materials may be used each alone, or can be used in combination with two or more than two kinds of materials thereof, and if need be, can be applied a pretreatment with coupling agents based on silane or titanium. A particularly preferable reinforcing material is glass fiber. As for the type of glass fiber, there is no particular limitation to it, and there can be used those which are generally used in reinforcing resins. The glass fiber to be used can be selected from, for example, chopped strands of long fiber type and short fiber type, chopped strand mat, continuous long fiber mat, cloth-like glass such as fabric, knit fabric, or the like, and milled fiber.

The content of a reinforcing material in a composite dielectric material preferably falls in the range from 10 to 30 wt %, and more preferably from 15 to 25 wt %.

A composite dielectric material of the present invention is preferably produced by the following method.

At the beginning, a dielectric powder having spherical particle shape is obtained according to the above described method. Then, the dielectric powder having spherical particle shape and a resin are mixed together in prescribed amounts. The mixing can be performed, for example, by a dry mixing method, but it is preferable that the mixing is fully performed in an organic solvent such as toluene, xylene, or the like by use of a ball mill, a stirring machine, or the like.

The slurry thus obtained is dried at 90 to 120° C. to obtain the chunks composed of the dielectric powder and the resin. The chunks are pulverized to obtain the mixed powder composed of the dielectric powder and the resin. The process from slurry to mixed powder preferably uses a production apparatus of granular powder such as a spray drier, or the like.

The mean particle size of the mixed powder is recommended to be about 50 to 1000 μm.

Then, the mixed powder undergoes press molding at 100 to 150° C. into a desired shape, and the molded substance is cured at 100 to 200° C. for 30 to 480 min. In the course of this curing process, a reinforcing material described above is allowed to be involved.

As for the composite dielectric material of the present invention, as described above, a dielectric powder is preferably mixed in before the polymerization or the curing of a resin such as a polyvinyl benzyl ether compound, or the like, but it may be mixed in after the polymerization or the curing as the case may be. It is not preferable, however, that the dielectric powder is mixed in after completion of curing.

A composite dielectric material of the present invention can be used in a variety of shapes such as film, a molded body in bulk form or in a prescribed shape, a film lamination, or the like. Accordingly, it can be used for a variety of substrates for use in electronic equipments and electronic parts (resonators, filters, condensers, inductors, antennas, and the like) for use in the high frequency band; for filters (for example, a C filter which is a multilayer substrate) and resonators (for example, a triplate resonator) as chip parts; for supporting bases for dielectric resonators or the like; furthermore, for housings for a variety of substrates or electronic parts (for example, an antenna rod housing); for casings, and for electronic parts and housings or casings thereof, or the like. As for the substrates, they are expected to be alternative to conventional glass fabric based eopoxy resin substrates, and specifically examples include on-board substrates for use in mounting parts, copper-clad laminates, metal based/metal core substrates, and the like. Furthermore, the substrates can be used for circuit integrated boards and antenna substrates (patch antenna and the like). In addition, they can be used for on-board substrates for CPU.

Incidentally, in formation of an electrode, a composite dielectric powder is placed between metal foil sheets of copper or the like, and cured while pressing; or a foil sheet of copper or the like is attached to one side surface of a molded body of the composite dielectric powder, or two metal foil sheets on both side surfaces, before completion of curing, and the curing can be performed while pressing. In addition, an electrode may be formed as follows: a temporary curing is performed after attaching metal foil sheet by pressing, and subsequently a separate curing is performed by heat treatment; and the molded substance is cured, and then undergoes the metal evaporation, metal sputtering, electrolytic-less plating, or coating with (resin) electrode or the like.

A composite dielectric material of the present invention and a board using thereof can be used suitably in the GHz band, and can have a dielectric constant $\epsilon$ of 8 or above and a Q value of 300 or above in the case of the 2 GHz band.

With reference to the following specific examples, detailed description will be made below on the present invention.

EXAMPLE 1

To the barium titanate ($BaTiO_3$) particles with the mean particle size of 0.8 μm obtained by a precipitation method, the spray granulation method was applied to yield a granular powder with the mean particle size of 6.9 μm. The granular powder had a sphericity of 0.93 and a tap density of 2.3 g/cm$^3$. In addition, the particle size distribution of the granular powder was measured to give the 10% diameter of 1.48 μm and the 90% diameter of 12.3 μm. Accordingly, the ratio between the 10% diameter and the 90% diameter of this granular powder is 8.3.

Incidentally, the 10% diameter means the particle size at which size point the cumulative curve becomes 10%, where the cumulative curve is obtained with the total volume of the measured powder taken to be 100%. Similarly, the 90% diameter is the particle size at which size point the cumulative curve becomes 90%. Accordingly, it is meant that the smaller is the difference between the 10% diameter and the 90% diameter, the narrower is the particle size distribution, while the larger is the difference, the wider is the particle size distribution.

By using the apparatus shown in FIG. 1, the combustion flame 15 was generated while feeding LPG from the combustion gas feeding pipe 13 and oxygen from the oxygen feeding pipe 14, and the above described granular powder was fed together with oxygen as the carrier gas into the combustion flame 15. Incidentally, the flow rates of oxygen and LPG for generating the combustion flame 15 were 10.0 l/min and 2.0 l/min, respectively. And the flow rate of oxygen as the carrier gas was 1.0 l/min. For the obtained powder, the mean particle size was 6.6 μm, the 10% diameter was 1.36 μm, and the 90% diameter was 10.2 μm. Accordingly, the ratio between the 10% diameter and the 90% diameter of the obtained powder is 7.5, a value smaller than 30. In addition, the tap density was 2.9 g/cm$^3$, and the sphericity of the particles constituting the powder reached 0.98.

EXAMPLE 2

The powder of titanium oxide (TiO$_2$) with the mean particle size of 0.1 μm and the powder of barium carbonate (BaCO$_3$) with the mean particle size of 0.15 μm, both obtained by the precipitation method, were mixed with each other in the molar ratio of 1.0:1.0, and the slurry with 50 wt % solid component was prepared. The slurry underwent the spray granulation, a granular powder with the mean particle size of 11.5 μm was produced. The granular powder is a powder in which particles of two kinds of compounds are aggregated in a state of being in contact with each other. In addition, for the granular powder, the sphericity was 0.92, and the tap density was 2.0 g/cm$^3$. The particle size distribution was measured to give the 10% diameter of 1.3 μm and the 90% diameter of 19.6 μm. Accordingly, the ratio between the 10% diameter and the 90% diameter of the granular powder is 15.1.

Similarly to Example 1, in the apparatus shown in FIG. 1, the combustion flame 15 was generated and the above described granular powder was fed into the combustion flame 15 with oxygen as the carrier gas. Incidentally, the flow rates of oxygen and LPG for generating the combustion flame 15 were 12.0 l/min and 2.3 l/min, respectively. And the flow rate of oxygen as the carrier gas was 1.0 l/min.

For the obtained powder, the mean particle size was 8.6 μm, and according to the SEM (scanning electron microscope) observation, the greater part of particles had flat and smooth surfaces, the overall sphericity reached 0.95. The particle size distribution was measured to give the 10% diameter of 1.1 μm and the 90% diameter of 11.3 μm (for this powder, the ratio between the 10% diameter and the 90% diameter is 10.3), and the tap density of 2.8 g/cm$^3$. In addition, from the observation of the constitution phase of the obtained spherical powder by X-ray diffraction, it was confirmed that barium titanate (BaTiO$_3$) constituted the main phase.

COMPARATIVE EXAMPLE 1

The powder of titanium oxide (TiO$_2$) with the mean particle size of 0.1 μm and the powder of barium carbonate (BaCO$_3$) with the mean particle size of 0.15 μm, both obtained by the precipitation method, were mixed with each other in the molar ratio of 1.0:1.0, and subsequently the calcination was performed at 1250° C. for 4 hours. The calcinated powder obtained was pulverized and a barium titanate (BaTiO$_3$) powder with the mean particle size of 7.2 μm was obtained.

The SEM observation of the powder confirmed that the powder was composed of particles with irregular shapes. The particle size distribution of the powder was measured to give the 10% diameter of 0.88 μm and the 90% diameter of 22.4 μm (the ratio between the 10% diameter and the 90% diameter is 25.5).

Similarly to Example 1, in the apparatus shown in FIG. 1, the combustion flame 15 was generated and the above described granular powder was fed into the combustion flame 15 with oxygen as the carrier gas. Incidentally, the flow rates of oxygen and LPG for generating the combustion flame 15 were 10.0 l/min and 2.0 l/min, respectively. And the flow rate of oxygen as the carrier gas was 1.0 l/min.

The mean particle size of the obtained powder was 6.9 μm. The particle size distribution was measured to give the 10% diameter of 0.81 μm and the 90% diameter of 18.4 μm (the ratio between the 10% diameter and the 90% diameter is 22.7). From the SEM observation, it was confirmed that a greater part of particles had flat and smooth surfaces. However, it was also confirmed that the particles with the particle size of 10 μm or above, which particles account for 30% of the whole particles, had still angular portions and the like, and did not become spherical. For the powder obtained, the sphericity was 0.87 and the tap density was 2.3 g/cm$^3$.

COMPARATIVE EXAMPLE 2

The powder of titanium oxide (TiO$_2$) with the mean particle size of 0.1 μm and the powder of barium carbonate (BaCO$_3$) with the mean particle size of 0.15 μm were mixed with each other in the molar ratio of 1.0:1.0. Similarly to Example 1, in the apparatus shown in FIG. 1, the combustion flame 15 was generated and the above described granular powder was fed into the combustion flame 15 with oxygen as the carrier gas. Incidentally, the flow rates of oxygen and LPG for generating the combustion flame 15 were 12.0 l/min and 2.3 l/min, respectively. And the flow rate of oxygen as the carrier gas was 1.0 l/min.

The mean particle size of the obtained powder was 0.9 μm. According to the results of the SEM observation, the particles had flat and smooth surfaces, and the sphericity reached 0.91. The constitution phase of the obtained powder was observed by X-ray diffraction, and it was confirmed that the particles were constituted by the mixtures composed of a lot of substances such as TiO$_2$, BaO, BaTiO$_3$, Ba$_2$TiO$_4$, BaCO$_3$, and the like.

EXAMPLE 3

The material powders of Nd$_2$O$_3$, BaO, and TiO$_2$ were mixed together for 10 min by use of a fluid granulation-drying apparatus (the product's name: Pulvis Mini-bed GA-22 manufactured by Yamato Scientific Co., Ltd.) so as to have the composition in which the contents of Nd$_2$O$_3$, BaO, and TiO$_2$ were respectively 16.67 mol %, 15.67 mol %, and 67.66 mol %, and fired in the air at 900° C. for 10 hours to obtain a dielectric material. Then the dielectric material was pulverized by a ball mill so as to have the mean particle size of 1.5 μm to obtain a dielectric ceramics powder. To the dielectric ceramics powder, a 0.6 wt % PVA (polyvinyl alcohol) solution was added in the ratio of 10 wt %, and a granular powder was produced by use of a spray dryer.

Then, by using the apparatus shown in FIG. 1, the combustion flame 15 was generated while feeding LPG from the combustion gas feeding pipe 13 and oxygen from oxygen feeding pipe 14, and the above described granular powder was fed together with oxygen as the carrier gas into the combustion flame 15. Incidentally, the flow rates of oxygen and LPG for generating the combustion flame 15, and the flow rate of oxygen as the carrier gas were the same as in Example 1. For the powder thus obtained, the mean particle size was 2.276 μm, the 10% diameter was 0.97 μm, and the 90% diameter was 5.56 μm. Namely, the ratio between the 10% diameter and the 90% diameter was only 5.7. In addition, the tap density was 5.76 g/cm$^3$, and the sphericity of the particles constituting the powder reached 0.93.

As a comparison example, the above described dielectric material produced, so as to have the composition in which the contents of Nd$_2$O$_3$, BaO, and TiO$_2$ were respectively 16.67 mol %, 15.67 mol %, and 67.66 mol %, was pulverized by use of a ball mill to obtain a pulverized powder with the mean particle size of 1.757 μm (a dielectric ceramics powder).

Then, a resin was mixed in each of the spherical powder and pulverized powder to obtain composite dielectric material. Incidentally, the content of the dielectric ceramics powder in the composite dielectric material was made to be 40 vol % in both spherical powder and pulverized powder, and the resin used was a polyvinyl benzyl ether compound represented by formula (1) in FIG. 7.

For the purpose of comparing the dispersion properties of the composite dielectric material based on the spherical powder (hereinafter referred to as Sample 1) and the composite dielectric material based on the pulverized powder (herein after referred to as Sample 2), the following substrates were obtained as described below. Patterns were formed by use of a glass fabric based epoxy resin, and the plates were made of a copper foil coated respectively with Sample 1 and Sample 2. The substrates provided with the patterns and the plates were inserted in a press and press molding was performed under the conditions specified below to obtain substrates. Here, it should be noted that it was difficult to fill the composite dielectric materials in the pattern edges formed on the substrates. Accordingly, the fluidity was judged as satisfactory in the case where the composite dielectric material was filled in even near the pattern edges, while the fluidity was judged as poor in the case where the composite dielectric material was not filled in near the pattern edges.

Press molding conditions:
Pressure: 40 kgf/cm$^2$
Temperature: the temperature was increased from room temperature up to 150° C., and maintained at that temperature for 30 min. Subsequently, the temperature was increased up to 195° C., and maintained at that temperature for 3 hours.

Figure 4:
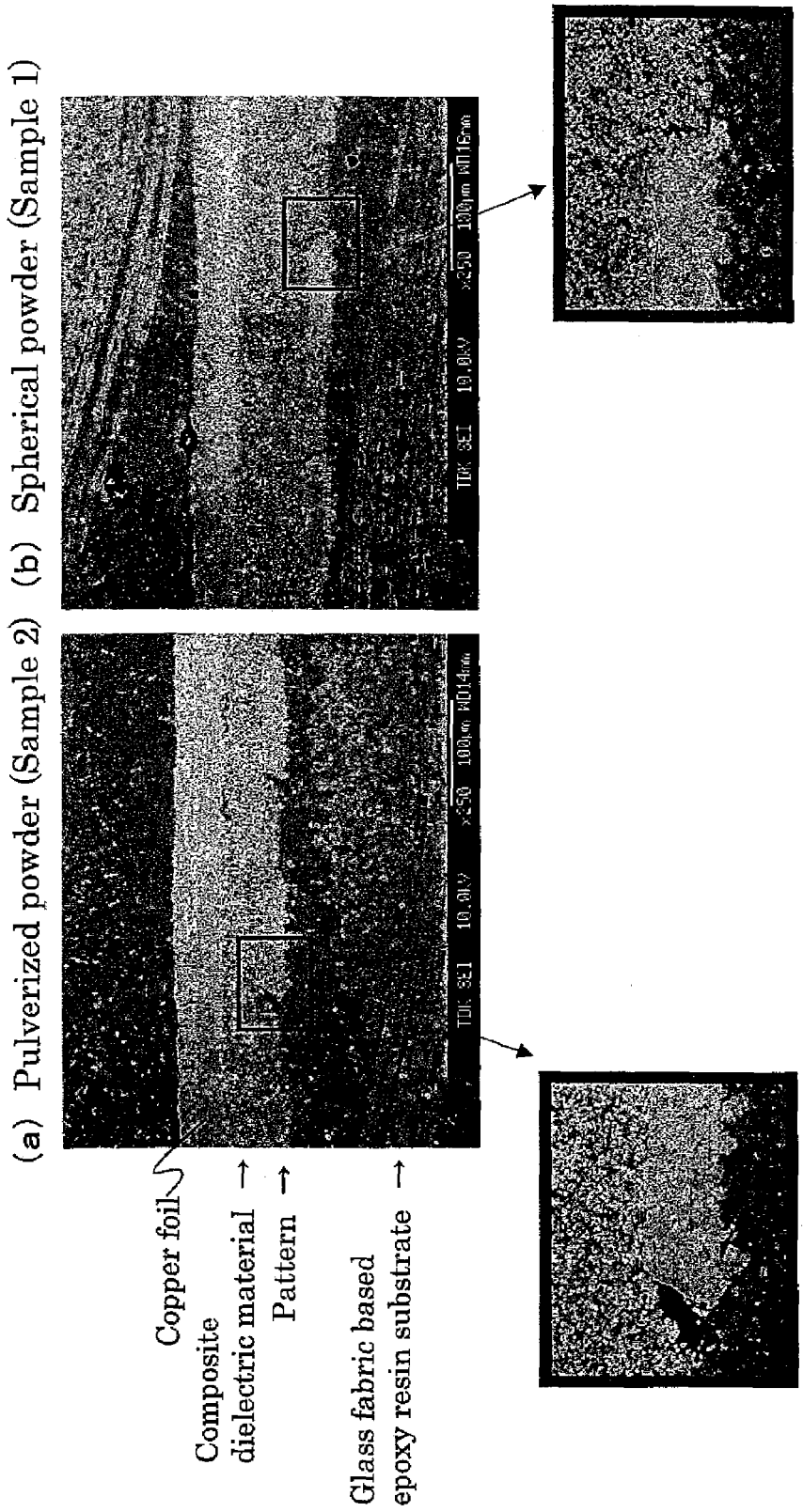
FIG. 4 is a figure showing the results of the microscopic observation of the sections in Samples 1 and 2 produced in Example 3.
Figure 5:
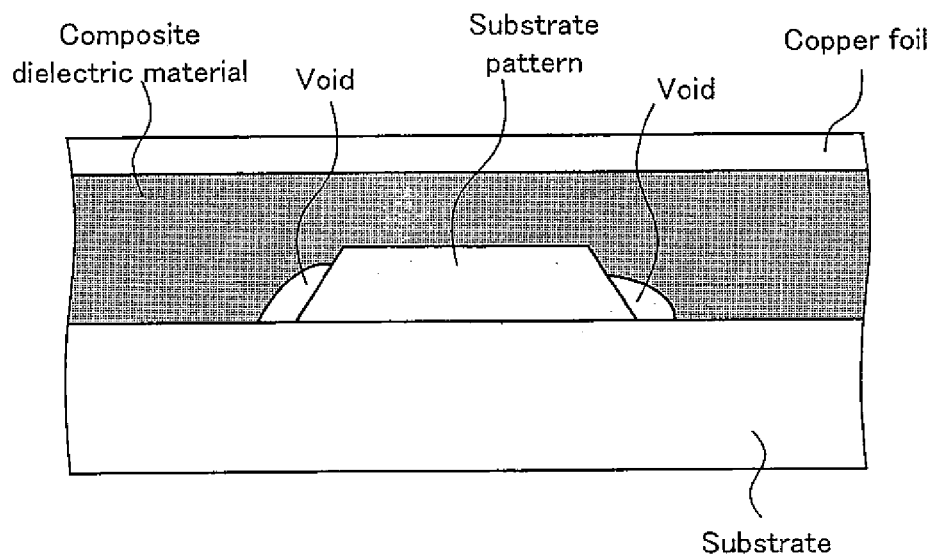
FIG. 5 is a figure showing schematically the results of the microscopic observation of the sections in Samples 1 and 2 produced in Example 3.
Figure 5:
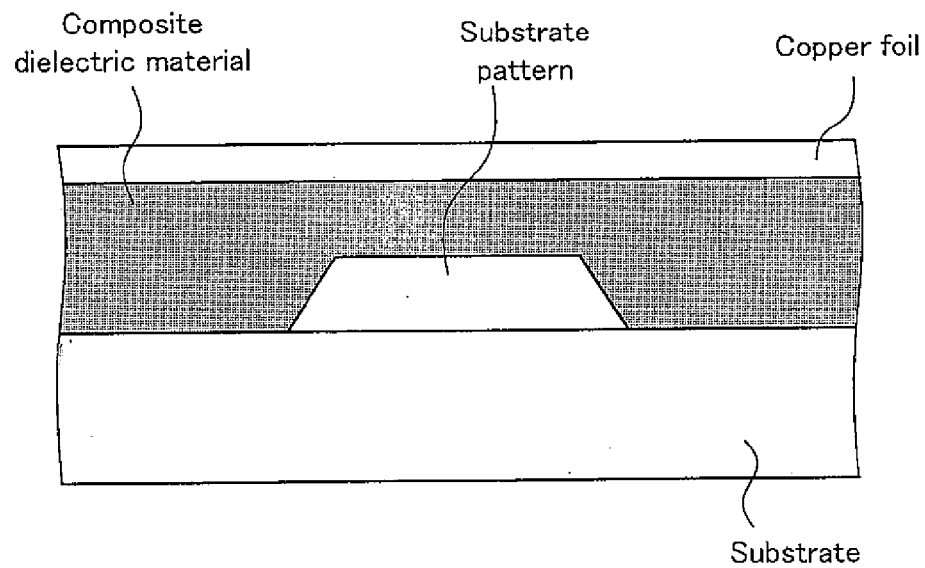

Microscopic observation was performed on the sections of the substrate produced by using Sample 1 and the substrate produced by using Sample 2. The results obtained are shown in FIGS. 4 and 5. FIG. 5 shows schematically the sections shown in FIG. 4.

As shown in FIGS. 4(a) and 5(a), voids were confirmed to exist near the pattern edges in the case where the substrate was produced with Sample 2. On the contrary, as shown in FIGS. 4(b) and 5(b), it was confirmed that the composite dielectric material was able to be densely filled in near the pattern edges in the case where Sample 1, namely, a spherical powder having a uniform particle size was used. From the above results, it has been found that when a spherical powder is used, the fluidity of the composite dielectric material itself is improved as compared to the case where a pulverized powder is used, and the composite dielectric material can be filled in without forming voids on the substrate.

EXAMPLE 4

Description will be made, by referring to as Example 4, on an experiment performed for the purpose of confirming the variations of the dielectric properties in a composite dielectric substance caused by the variations in the filled-in amount of a dielectric ceramics powder.

The spherical dielectric ceramics powder obtained in Example 3 was mixed in a polyvinyl benzyl ether compound represented by formula (1) to obtain Samples 3 to 5. The filled-in amounts of the spherical powder in Samples 3 to 5 were respectively 40 vol %, 45 vol %, and 50 vol %. Boards were produced using Samples 3 to 5 in a manner similar to that in Example 3, and the dielectric constant $\epsilon$ (2 GHz) was measured for each of the substrates produced by means of the cavity resonator method (a perturbation method) (the apparatus manufactured by Hewlett Packard, Inc., 83260A and 8757C were used). Furthermore, the Q values were also obtained. The results thus obtained are shown in FIG. 6. Incidentally, for the convenience of comparison, there are also shown simultaneously in FIG. 6 the dielectric constant $\epsilon$ and Q value of Sample 2 produced in Example 3.

As shown in FIG. 6, Samples 3 to 5 all exhibited the dielectric constants $\epsilon$ of 8 or above and the Q values of 300 or above, and hence it has been confirmed that Samples 3 to 5 all have satisfactory dielectric properties. In addition, as shown in FIG. 6, the dielectric properties are improved with increasing content of the dielectric ceramics powder, and it is noticed that when the content of the dielectric ceramics powder becomes 45 vol % or above, the dielectric constant $\epsilon$ of 10 or above is shown while still maintaining a high Q value of 350 or above even at a high frequency of 2 GHz. A comparison between the dielectric properties of Sample 3 (spherical powder) and that of Sample 2 (pulverized powder) both containing the dielectric ceramics powder of 40 vol % shows that Sample 2 shows a satisfactory dielectric constant $\epsilon$, but the Q value thereof is 329 which is lower than the Q value of Sample 3 (349) even by 20.

A microscopic examination of the section of Sample 5 gave a confirmation that the spherical particles got into near the pattern edges. Accordingly, it is expected that when a spherical powder having a uniform particle size is used, the content of a dielectric ceramics powder in a composite dielectric substance can be increased to 60 vol % or above, or furthermore, up to a value close to 70 vol %.

INDUSTRIAL APPLICATION

As described above in detail, according to the present invention, a granular powder is used as a material, and hence there can be obtained a spherical oxide powder which is narrow in the width of the particle size distribution. Moreover, according to the present invention, a spherical oxide powder is obtained by use of a combustion flame, and hence a cost reduction can be achieved as compared with the case where a spherical oxide powder is obtained by use of a plasma flame. In addition, according to the present invention, there can be obtained a composite dielectric material and a substrate which are high in dielectric constant $\epsilon$ and low in tan $\delta$, and are suitable for use in the GHz high frequency band.

What is claimed is:

1. A production method of spherical oxide powder comprising:
   a feeding step in which a granular powder composed of an oxide composition is fed into a combustion flame together with a carrier gas;
   a melting step in which said fed granular powder is melted in said combustion flame to obtain a melt; and
   a solidifying step in which said melt is solidified by being moved and placed outside said combustion flame, to form a spherical oxide powder,
   wherein said spherical oxide powder obtained through said solidifying step is 1 to 10 μm in mean particle size and 0.9 or above in sphericity, and wherein said melt is solidified in said solidifying step under temperatures corresponding to a plurality of heating means wherein said temperatures gradually decrease along a traveling direction of said melt.

2. A production method of a spherical oxide powder according to claim 1, wherein said granular powder is composed of the same oxide as in said spherical oxide powder obtained through said solidifying step.

3. A production method of a spherical oxide powder according to claim 1, wherein said granular powder is composed of plural kinds of compound particles.

4. A production method of a spherical oxide powder according to claim 1, wherein said spherical oxide powder obtained through said solidifying step is constituted by a dielectric material composed of a composite oxide.

* * * * *